(12) United States Patent
Ota

(10) Patent No.: US 6,376,101 B1
(45) Date of Patent: Apr. 23, 2002

(54) EPOXY RESIN COMPOSITION AND SEMICONDUCTOR DEVICES

(75) Inventor: Ken Ota, Utsunomiya (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 0 days.

(21) Appl. No.: 09/669,772

(22) Filed: Sep. 26, 2000

(51) Int. Cl.$^7$ ................................. H01L 29/12

(52) U.S. Cl. .................. 428/620; 257/788; 257/793; 523/466; 525/485; 525/486; 525/488

(58) Field of Search ............. 523/466; 525/485, 525/486, 488; 428/620; 257/788, 793

(56) References Cited

U.S. PATENT DOCUMENTS 6,001,901 A 12/1999 Shiobara et al. ............ 523/443
6,143,423 A * 11/2000 Shiobara et al. ............ 428/620

FOREIGN PATENT DOCUMENTS

DE 19845021 4/1999

OTHER PUBLICATIONS

European Search Report dated Nov. 2, 2001.
Database WPI, Section Chh, Week 199910, Derwent Publication Ltd., London, GB; Class A21, AN 1999 114847, XP 002180204 (12/98).

* cited by examiner

Primary Examiner—Robert Dawson
Assistant Examiner—D. Aylward
(74) Attorney, Agent, or Firm—Smith, Gambrell & Russell

(57) ABSTRACT

The present invention provides an epoxy resin composition having excellent moldability, flame retardancy and soldering resistance and low in water absorption. More specifically, it provides an epoxy resin composition for semiconductor encapsulation comprising (A) an epoxy resin in which the proportion of the carbon atoms of aromatic derivation to the whole carbon atoms in the epoxy resin is 70% or more, (B) a phenol resin in which the proportion of the carbon atoms of aromatic derivation to the whole carbon atoms in the phenol resin is 70% or more and whose phenolic hydroxy equivalent is 140 to 300, (C) a curing accelerator, and (D) an inorganic filler whose content W (wt %) in the whole epoxy resin composition satisfies $88 \leq W \leq 94$, characterized in that the combustion starting temperature in thermogravimetric analysis of the cured epoxy resin composition in the air atmosphere is 280° C. or higher, or the retention A (wt %) of the cured product in said TG analysis satisfies $W+[0.1 \times (100-W)] \leq A$.

20 Claims, 1 Drawing Sheet

EPOXY RESIN COMPOSITION AND SEMICONDUCTOR DEVICES

BACKGROUND OF THE INVENTION

The present invention relates to an epoxy resin composition for encapsulating semiconductor elements, which composition is low in water absorption and has excellent soldering resistance, and to semiconductor devices using this resin composition for encapsulation.

Epoxy resin compositions (hereinafter referred to merely as resin compositions) have been developed and utilized for protecting semiconductor elements from mechanical and chemical actions. The matters required for these resin compositions in their practical applications vary according to the type of semiconductor elements to be encapsulated, the type of a semiconductor device comprising such encapsulated elements, the use environment and other factors.

Increase of surface-mounted semiconductor devices has called for the development of resin compositions with low water absorption, and a large variety of resin compositions suited for such use have been proposed.

Currently, with increasing seriousness of the environmental problems, request for resin compositions containing neither halogen compound nor antimony oxide has become very strong. In order to comply with such a request, resin compositions using various types of flame-retardants other than halogen compounds and antimony oxide, and resin compositions not using even such flame-retardants have been proposed. At present, however, there is available no encapsulating resin composition which can perfectly satisfy requirements for good moldability, low water absorption, high soldering resistance, etc.

The present invention is envisioned to provide an epoxy resin composition for semiconductor encapsulation having excellent moldability and flame retardancy, low water absorption and high soldering resistance, and semiconductor devices using this resin composition for encapsulation.

Specifically, the present invention pertains to an epoxy resin composition for semiconductor encapsulation comprising (A) an epoxy resin in which the proportion of carbon atoms of aromatic derivation to the whole carbon atoms in the epoxy resin is 70% or more, (B) a phenol resin in which the proportion of carbon atoms of aromatic derivation to the whole carbon atoms in the phenol resin is 70% or more and whose phenolic hydroxy equivalent is 140 to 300, (C) a curing accelerator, and (D) an inorganic filler whose content W (wt %) in the whole epoxy resin composition satisfies $88 \leq W \leq 94$, characterized in that the combustion starting temperature in thermogravimetric analysis of the cured epoxy resin composition in the air atmosphere is 280° C. or higher. The present invention also relates to an epoxy resin composition for semiconductor encapsulation comprising (A) an epoxy resin in which the proportion of carbon atoms of aromatic derivation to the whole carbon atoms in the epoxy resin is 70% or more, (B) a phenol resin in which the proportion of carbon atoms of aromatic derivation to the whole carbon atoms in the phenol resin is 70% or more and whose phenolic hydroxy equivalent is 140 to 300, (C) a curing accelerator, and (D) an inorganic filler whose content W (wt %) in the whole epoxy resin composition satisfies $88 \leq W \leq 94$, characterized in that the retention A (wt %) of the cured product in thermogravimetric analysis of the cured epoxy resin composition in the air atmosphere satisfies $W+[0.1 \times (100-W)] \leq A$.

In a more preferred embodiment of the present invention, there are provided the epoxy resin compositions as described above, in which the epoxy resin is the one represented by the following formula (1):

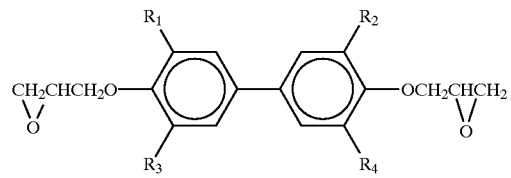

(1)

wherein $R_1$ to $R_4$ are a hydrogen atom, a phenyl group or a methyl group and may be identical or different, or the one represented by the following formula (2):

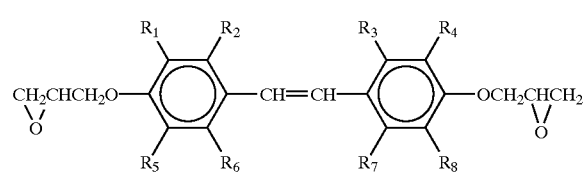

(2)

wherein $R_1$ to $R_8$ are a hydrogen atom, a methyl group or a tertiary butyl group and may be identical or different, and the phenol resin is the one presented by the following formula (3):

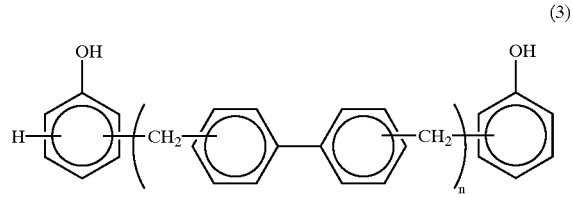

(3)

wherein n is a mean value which is a positive number of 1 or greater, the one represented by the following formula (4):

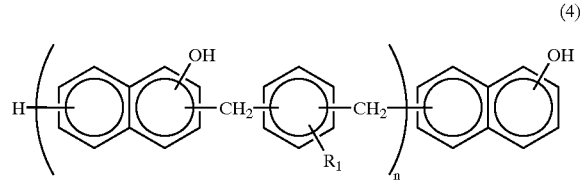

(4)

wherein $R_1$ is a hydrogen atom or a methyl group, and n is a mean value which is a positive number of 1 or greater, or a resin produced by conducting polycondensation of a petroleum heavy oil, formaldehyde polycondensate and a phenol. It is also envisaged in the present invention to provide semiconductor devices comprising semiconductor elements encapsulated with the above-described resin compositions.

Figure 1:
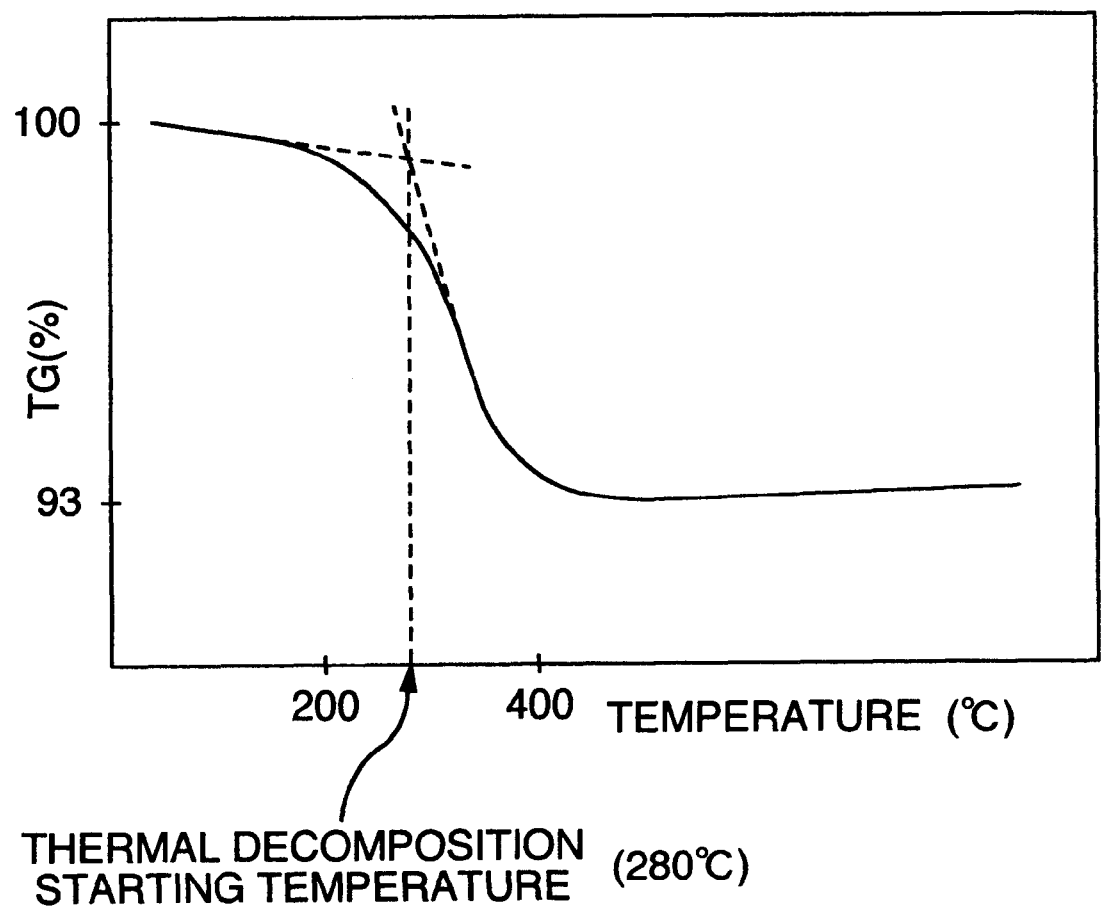
FIG. 1 is a graphic representation of the relation between TG curve and temperature at which thermal decomposition begins.

The epoxy resin used in the present invention is specified by the fact that the proportion of carbon atoms of aromatic derivation to the whole carbon atoms in the epoxy resin is 70% or more. Increase of the proportion of the carbon atoms of aromatic derivation provides a corresponding betterment of flame retardance of the resin composition using the epoxy resin. Because of excellent flame retardancy of the above-specified epoxy resin, even the resin compositions of the present invention containing no flame-retardant such as a halogen compound or antimony oxide show high flame retardancy and can maintain the UL-94 flame retardancy level of V-0 when a phenol resin is incorporated in the compositions as a curing agent, which is described below. Also, owing to good reactivity with phenol resins, the resin compositions of the present invention have good moldability and high mechanical strength.

The term "carbon atoms of aromatic derivation" used in the present invention refers to the carbon atoms composing an aromatic ring such as benzene ring, naphthalene ring, anthracene ring or pyrene ring as well as the carbon atoms which are directly bonded to the carbon atoms in aromatic rings. The reason why the carbon atoms directly bonded to an aromatic ring are included in the carbon atoms of aromatic derivation is that such directly bonded carbon atoms are supposed to be hardly decomposed thermally since the carbon-carbon bond energy of the carbon atoms directly bonded to an aromatic ring is greater than the bond energy of the carbon atoms not directly bonded to an aromatic ring.

The proportion of the carbon atoms of aromatic derivation was calculated from the chemical structure of the epoxy resin. For instance, in the case of toluene, methyl group is directly bonded to an aromatic ring and hence included in the carbon atoms of aromatic derivation, so that, in this case, the proportion of the carbon atoms of aromatic derivation is 100%. In the case of cumene, however, since there are 6 carbon atoms composing an aromatic ring, one non-aromatic carbon atom directly bonded to an aromatic ring and 2 carbon atoms not directly bonded to an aromatic ring, the proportion of the carbon atoms of aromatic derivation is calculated as: $(6+1)/(6+1+2) \times 100 = 78$ (%).

The epoxy resin used in the present invention is not particularly specified; it is possible to use any epoxy resin which meets the above condition, for example, biphenyl type epoxy resins represented by the formula (1) such as (3,3',5,5')-tetramethyl-4,4'-biphenoldiglycidyl ether and diphenyl-4,4'-biphenoldiglycidyl ether, stilbene type epoxy resins represented by the formula (2), orthocresol novolak type diglycidyl ether, triphenolmethane type diglycidyl ether, bisphenol A type epoxy resins, and bisphenol F type epoxy resins.

The epoxy resins in which the proportion of the carbon atoms of aromatic derivation is 70% or more can be used in combination with other types of epoxy resin. In this case, the amount of the epoxy resin in which the proportion of the carbon atoms of aromatic derivation is 70% or more, is preferably not less than 70% by weight in the whole epoxy resin. If it is less than 70% by weight, flame retardancy of the composition deteriorates. The "other types of epoxy resin" usable in the present invention are not particularly specified, but dicyclopentadiene-modified phenolic epoxy resins are preferably used.

As for the specific properties of the epoxy resin used in the present invention, although the resin is not particularly limited regarding melting point, softening point, melt viscosity, amount of ionic impurities, etc., it is desirable that the resin be minimized in content of ionic impurities for providing better reliability.

The phenol resin used in the present invention is featured by the fact that the proportion of the carbon atoms of aromatic derivation to the whole carbon atoms in the phenol resin is 70% or more, and that the phenolic hydroxy equivalent of the resin is 140 to 300. Calculation of the number of the carbon atoms of aromatic derivation in the phenol resin was made in the same way as in the case of the epoxy resin described above.

It has been found that if the phenolic hydroxy equivalent of the phenol resin is less than 140, the functional group density per unit volume (molar number of phenolic hydroxyl groups per unit volume) becomes too high, giving an adverse effect to flame retardancy of the composition. Epoxy groups and phenolic hydroxyl groups are susceptible to thermal decomposition and generate combustible gas when thermally decomposed, so that increase in molar number of these functional groups leads to remarkable deterioration of flame retardancy. Thus, decrease in molar number of the above functional groups, namely reduction of the functional group density, is deemed to be an effective means for improving flame retardancy. When the phenolic hydroxy equivalent exceeds 300, on the other hand, the functional group density becomes too low, resulting in reduced reactivity, and hence deteriorated curing characteristics and moldability of the composition.

Preferred examples of the phenol resins usable in the present invention are phenol resins represented by the formula (3), naphthol aralkyl resins represented by the formula (4), and modified phenol resins produced by conducting polycondensation of petroleum heavy oil, formaldehyde polycondensate, and phenols (as disclosed in JP-A-7-252339 and JP-A-9-216927). Phenol aralkyl resins are also usable. The phenol resins used in the present invention are not specifically limited in their properties such as melting point, softening point, melt viscosity and ionic impurity content, but it is desirable that the ionic impurity content be as low as possible for providing better reliability.

A phenol resin in which the proportion of carbon atoms of aromatic derivation is 70% or more, which is used as an essential component of the composition of the present invention, can be used in combination with other types of phenol resin. In the case of combined use, the amount of the phenol resin in which the proportion of carbon atoms of aromatic derivation is 70% or more, is preferably not less than 70% by weight in the whole phenol resins. If its amount is less than 70% by weight, the produced composition proves to be intolerably low in flame retardancy. The "other types of phenol resin" usable in the present invention are not particularly limited, but dicyclopentadiene modified phenol resins, phenolic novolak resins and the like are preferably used.

The equivalent ratio of the number of epoxy groups in the whole epoxy resins used in the present invention to the number of phenolic hydroxyl groups in the whole phenol resins is preferably in the range from 0.5 to 2, more preferably from 0.7 to 1.5. If the equivalent ratio is outside the above range, the produced composition is unsatisfactory in humidity resistance, curing characteristics, etc.

The curing accelerator used in the present invention is not particularly limited; it is possible to use any type of curing accelerator which is capable of accelerating the reaction of epoxy groups with phenolic hydroxl groups. The examples of such a curing accelerator are 1,8-diazabicyclo(5,4,0)undecene-7, triphenylphosphine, tetraphenylphosphonium tetraphenyl borate, tetraphenylphosphonium tetrabenzoic acid borate, tetraphenylphosphonium tetranaphthoic acid borate and the like, which may be used either singly or as a mixture.

The type of the inorganic filler used in the present invention is not particularly restricted; it is possible to use all types of inorganic filler which are generally used for encapsulating materials, the examples of such inorganic fillers being fused crushed silica powder, fused spherical silica powder, crystalline silica powder, secondary agglomerated silica powder, alumina, titanium white, aluminum hydroxide, talc, clay and glass fiber, of which fused spherical silica powder is especially preferred. The particle shape is preferably as close to sphere as it can be. It is possible to increase filling amount by mixing the particles of different sizes.

With regard to the proportions of components (A) to (D) in the epoxy resin composition of the present invention, the proportion of an epoxy resin (A) is 5–10% by weight, the proportion of a phenol resin curing agent (B) is 5–10% by weight, the proportion of a curing accelerator (C) is 0.05–2% by weight, and the proportion of an inorganic filler (D) is 88–94% by weight, on the basis of the total epoxy resin composition. When the proportion of an epoxy resin (A) is less than 5% by weight, curing is insufficient, and when said proportion exceeds 10% by weight, moldability is inferior. When the proportion of a phenol resin (B) is less than 5% by weight, curing is insufficient, and when said proportion exceeds 10% by weight, the problem that uncured material remains is caused. When the proportion of a curing accelerator (C) is less than 0.05% by weight, it takes a long time until curing is completed, and when said proportion exceeds 2% by weight, curing proceeds rapidly and satisfactory cured product cannot be obtained.

The inorganic filler used in the present invention needs to meet the requirement of $88 \leq W \leq 94$, preferably $88 \leq W \leq 92$ where W is the content (wt %) of the filler in the whole resin composition. When the content of the inorganic filler is high, water absorption of the composition is reduced and unburned inorganic filler, when exposed to flames, takes away heat energy from the flames to enhance flame retardancy of the cured product of the resin composition. Further, the modulus of elasticity of the cured product of the resin composition is enhanced, which contributes to the betterment of moldability (releasability) of said cured product. If the content of the inorganic filler is less than 88% by weight, the composition catches fire easily in the flame retardancy test and is also high in water absorption, and hence low in soldering resistance. If the content of the inorganic filler exceeds 94% by weight, the composition is excessively reduced in fluidity and becomes incapable of molding.

The resin composition of the present invention can hold the UL-94 flame retardancy level of V-0, even if no halogenous compound such as brominated epoxy resin or no antimony oxide such as antimony trioxide is blended in the composition as a flame-retardant. From the viewpoints of environmental protection and enhancement of reliability of the semiconductor devices kept under high temperatures, it is desirable that no flame-retardant is added to the resin compositions. When the conventional flame-retardants are blended, there could take place an excessive deterioration of high-temperature keeping quality of the composition to invite a performance reduction of the semiconductor devices. The present invention is quite significant in that satisfactory flame retardancy can be obtained without using any flame-retardant if a sufficient number of carbon atoms of aromatic derivation are provided in the composition.

The resin composition of the present invention, because of an increased number of aromatic rings in the molecule for improving flame retardancy, is characteristically unsusceptible to thermal decomposition in the air. The cured product of the resin composition of the present invention is characterized in that the thermal decomposition starting temperature in thermogravimetric analysis shown in FIG. 1 is 280° C. or higher. This fact greatly contributes to the improvement of flame retardancy.

The thermal decomposition starting temperature was determined using Seiko Electronics' TG/DTA 220 by heating a cured resin composition (prepared by pulverizing the cured product after 4-hour postcuring at 175° C. and precisely weighing out 5 to 10 mg of the pulverized product) at a rate of 20° C./min in the air atmosphere at an air flow rate of 200 ml/min. As shown in FIG. 1, the temperature at which thermal decomposition begins abruptly during heating is termed the thermal decomposition starting temperature. Good flame retardancy is obtained in the UL-94 test when the thermal decomposition starting temperature is 280° C. or higher. On the other hand, flame retardancy is low when the thermal decomposition starting temperature is below 280° C.

It was further found that in a resin composition which meets the requirement of $88 \leq W \leq 94$ where W is the content (wt %) of the inorganic filler in the whole resin composition, flame retardancy is also improved when the retention A (wt %) of the cured product after treatment at 500° C. for one hour in thermogravimetric analysis of the cured resin composition in the air atmosphere satisfies $W+[0.1\times(100-W)] \leq A$. When the content of the carbon atoms of aromatic derivation is higher, longer time is taken until the cured product is burned up, and the carbides of the resin components are not completely burned and left even after one-hour treatment at 500° C. If the value of retention A of the cured product is below $W+[0.1\times(100-W)]$, flame retardancy is low because combustion advances rapidly.

Retention A of the cured product in the present invention was determined in the following way. Using Seiko Electronics' TG/DTA 220, a cured resin composition (prepared by pulverizing the cured product after postcuring at 175° C. for 4 hours and precisely weighing out 5 to 10 mg of the pulverized product as a specimen) was heated at a rate of 20° C./min in the air atmosphere at an air flow rate of 200 ml/min, and after heated to 500° C., the specimen was maintained at this temperature for one hour, after which the residual amount of the cured product was determined and the determined value was divided by the amount of the specimen to give the retention A expressed by %.

In the resin composition of the present invention, besides the essential components (A) to (D) described above, there can be optionally blended various additives, for example, a silane coupling agent such as γ-glycidoxypropyltrimethoxysilane and γ-aminopropyltriethoxysilane, a colorant such as carbon black, a low-stress component such as silicone oil and silicone rubber, a releasing agent such as natural wax, synthetic wax, polyethylene wax, polyethylene oxide wax, higher fatty acids and their metal salts, and paraffin, an antioxidant and the like. Especially, silicone oil is very effective for reducing voids.

The resin composition of the present invention can be obtained by mixing the components (A) to (D) and optionally other additives by a mixer at normal temperature, kneading the mixture by a suitable kneader such as roll mill or extruder, and then cooling and comminuting the kneaded product.

For encapsulating semiconductor elements with the resin composition of the present invention to produce a semiconductor device, the composition may be cured and molded by a conventional molding method such as transfer molding, compression molding, injection molding, etc.

The present invention will be further illustrated with reference to the examples thereof, but evidently the scope of the present invention is not limited by these examples. In the following descriptions of Examples and Comparative Examples, the unit of the amounts of the materials blended is part by weight.

EXAMPLE 1

Epoxy resin (proportion of carbon atoms of aromatic derivation: 73%) mainly composed of an epoxy resin of the formula (E-1) 5.0 parts by weight

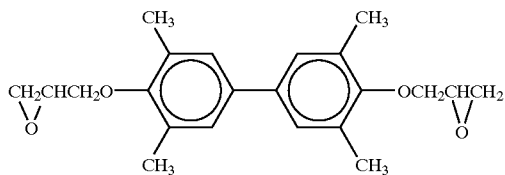

(E-1)

Phenol resin (proportion of carbon atoms of aromatic derivation: 100%) of the formula (H-1) 5.0 parts by weight

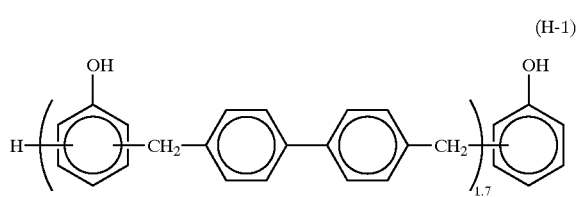

(H-1)

1.8-Diazabicyclo(5,4,0)undecene-7 (hereinafter abbreviated as DBU) 0.2 part by weight Fused spherical silica (average particle

| | |
|---|---|
| diameter: 15 μm) | 89 parts by weight |
| Epoxysilane coupling agent | 0.3 part by weight |
| Carbon black | 0.2 part by weight |
| Carnauba wax | 0.3 part by weight |

The above materials were mixed in the shown amounts by a mixer at normal temperature, kneaded by a two-roll mill at 100° C., and then cooled and comminuted to obtain a resin composition, and this resin composition was evaluated by the methods described below. The results are shown in Table 1.

Evaluation Methods

Thermal decomposition starting temperature: Determined by the method described above.

Retention of the cured product of the resin composition: Determined by the method described above.

Spiral flow: Determined at a molding temperature of 175° C. using a mold conforming to EMMI-I-66.

Flame retardancy: A 1.6 mm thick molded article was prepared and its combustion test was conducted according to UL-94.

Keeping quality at high temperature: 16-p DIP's mounted with mock elements were molded and, after postcuring, treated at 185° C. for 1,000 hours. Resistivity between wires after the above treatment was measured. The packages in which resistivity increased by 20% or more after the above treatment were regarded as defective. The number of the defective packages in the 15 packages was shown.

Soldering resistance: Using a low-pressure transfer molding machine, 80-p QFP's (package size: 14×20×2.7 mm; chip size: 90 mm×9 mm) were molded under the conditions of 175° C., 70 kg/cm² and a curing time of 2 minutes, and after 8-hour postcuring at 175° C., 6 packages were allowed to absorb moisture under the condition of 85° C. and 85% RH for a period of 168 hours and then subjected to IR reflowing at 235° C. The cracks in the packages were checked by an ultrasonic flaw detector. When there were n packages which developed cracks, the result was shown as n/6.

EXAMPLES 2 to 6

The resin compositions were obtained in the same way as in Example 1 according to the formulations of Table 1, and the obtained compositions were evaluated as in Example 1. The results are shown in Table 1.

Comparative Examples 1 to 6

The resin compositions were obtained in the same way as in Example 1 according to the formulations of Table 2, and the obtained compositions were evaluated as in Example 1. The results are shown in Table 2.

The structural formulas of the epoxy resins (E-2) and (E-3), the structural formulas of the phenol resins (H-2) and (H-4) to (H-6) and the explanation for the phenol resin (H-3) used in Examples 2 to 5 or comparative Examples 4 to 6 are shown below.

The proportion of the carbon atoms of aromatic derivation in the epoxy resin (E-2) is 72%, and that in the epoxy resin (E-3) is 42%. The proportion of the carbon atoms of aromatic derivation in the phenol resin (H-2) is 100% and that in the phenol resin (H-4) is 100%. The phenolic hydroxy equivalent of the phenol resin (H-5) is 98. The proportion of the carbon atoms of aromatic derivation in the phenol resin (H-5) is 100% and that in the phenol resin (H-6) is 50%. The phenol resin (H-3) is the one obtained by conducting polycondensation of a petroleum heavy oil, formaldehyde polycondensate and a phenol in the presence of an acid catalyst, and its softening point is 82° C., hydroxy equivalent is 145, ICI viscosity at 150° C. is 2.2 poises and proportion of the carbon atoms of aromatic derivation is about 95%.

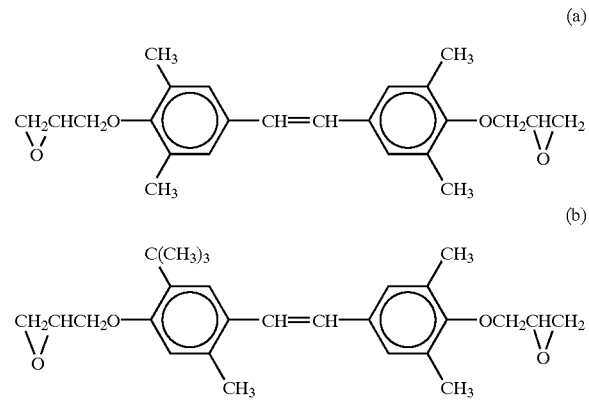

(a)

(b)

(E-2): fused mixture of (a) and (b), (a)/(b)=2/1

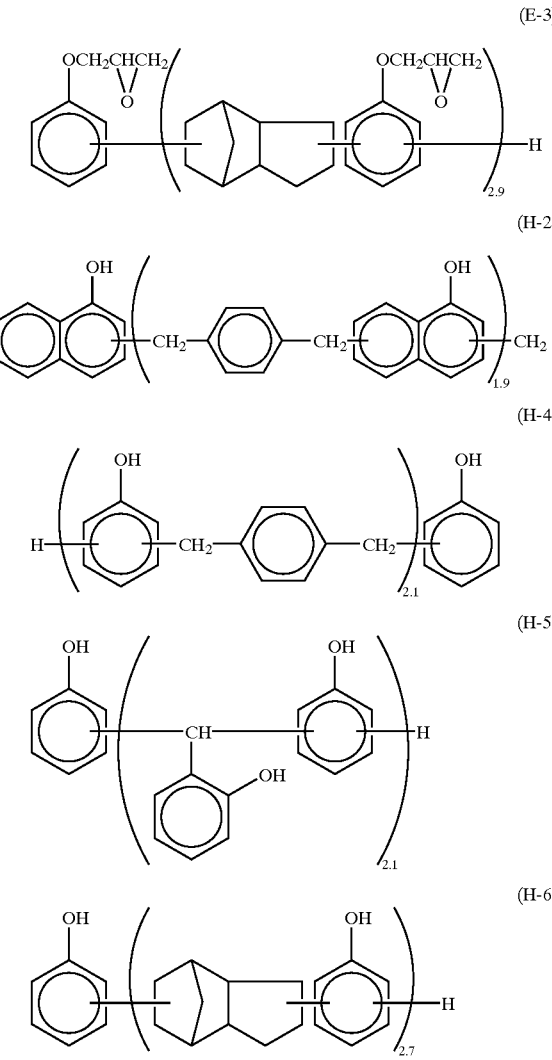

(E-3)

(H-2)

(H-4)

(H-5)

(H-6)

TABLE 1

|  | Examples | | | | | |
| --- | --- | --- | --- | --- | --- | --- |
|  | 1 | 2 | 3 | 4 | 5 | 6 |
| Epoxy resin (E-1) | 5.0 | 4.8 | 5.0 |  | 5.3 | 3.2 |
| Epoxy resin (E-2) |  |  |  | 5.0 |  |  |
| Curing agent (H-1) | 5.0 |  |  |  |  | 3.2 |
| Curing agent (H-2) |  | 5.2 |  | 5.0 |  |  |
| Curing agent (H-3) |  |  | 5.0 |  |  |  |
| Curing agent (H-4) |  |  |  |  | 4.8 |  |
| DBU | 0.2 |  |  |  | 0.2 |  |
| Triphenylphosphine |  | 0.2 | 0.2 | 0.2 |  | 0.1 |
| Fused spherical silica | 89 | 89 | 89 | 89 | 89 | 93 |
| Epoxysilane coupling agent | 0.3 | 0.3 | 0.3 | 0.3 | 0.3 | 0.2 |
| Carbon black | 0.2 | 0.2 | 0.2 | 0.2 | 0.2 | 0.2 |
| Carnauba wax | 0.3 | 0.3 | 0.3 | 0.3 | 0.3 | 0.2 |
| Thermal decomposition starting temperature (° C.) | 330 | 320 | 333 | 321 | 317 | 311 |
| Retension after one-hour treatment at 500° C. (%) | 92.0 | 91.4 | 93.5 | 92.0 | 93.2 | 95.1 |
| Spiral flow (cm) | 101 | 88 | 89 | 83 | 110 | 42 |
| Flame retardancy (1.6 mm) | V-0 | V-0 | V-0 | V-0 | V-0 | V-0 |
| Keeping quality at high temperature | 0/15 | 0/15 | 0/15 | 0/15 | 0/15 | 0/15 |
| Soldering resistance | 0/6 | 0/6 | 0/6 | 0/6 | 0/6 | 0/6 |

TABLE 2

|  | Comparative Examples | | | | | |
| --- | --- | --- | --- | --- | --- | --- |
|  | 1 | 2 | 3 | 4 | 5 | 6 |
| Epoxy resin (E-1) | 9.5 | 2.2 | 4.0 | 6.4 |  | 5.0 |
| Epoxy resin (E-3) |  |  |  |  | 5.2 |  |
| curing agent (H-1) | 9.0 | 2.1 | 4.0 |  | 4.8 |  |
| Curing agent (H-5) |  |  |  | 3.6 |  |  |
| Curing agent (H-6) |  |  |  |  |  | 5.0 |
| Brominated bisphenol A type epoxy resin |  |  | 1.0 |  |  |  |
| Antimony trioxide |  |  | 1.0 |  |  |  |
| DBU | 0.2 |  | 0.2 | 0.2 | 0.2 | 0.2 |
| Triphenylphosphine |  | 0.1 |  |  |  |  |
| Fused spherical silica | 80 | 95 | 89 | 89 | 89 | 89 |
| Epoxysilane coupling agent | 0.5 | 0.2 | 0.3 | 0.3 | 0.3 | 0.3 |
| Carbon black | 0.5 | 0.2 | 0.2 | 0.2 | 0.2 | 0.2 |
| Carnauba wax | 0.3 | 0.2 | 0.3 | 0.3 | 0.3 | 0.3 |
| Thermal decomposition starting temperature (° C.) | 314 | Unmoldable | 310 | 289 | 268 | 264 |
| Retention after one-hour treatment at 500° C. (%) | 83.2 | — | 90.3 | 90.0 | 91.0 | 89.7 |
| Spiral flow (cm) | 104 | Unmoldable | 103 | 89 | 91 | 77 |
| Flame retardancy (1.6 mm) | V-1 | Unmoldable | V-0 | completely burned | V-1 | Completely burned |
| Keeping quality at high temperature | 0/15 | Unmoldable | 15/15 | 0/15 | 0/15 | 0/15 |
| Soldering resistance | 6/6 | Unmoldable | 0/6 | 3/6 | 1/6 | 2/6 |

As apparent from Table 1, the epoxy resin compositions for semiconductor encapsulation according to the present invention have excellent moldability and flame retardancy and are also low in water absorption, and the semiconductor devices encapsulated with these resin compositions have high soldering resistance.

What is claimed is:

1. An epoxy resin for encapsulating semiconductor elements, consisting essentially of:
    (A) an epoxy resin in which the proportion of carbon atoms of aromatic derivation to all of the carbon atoms epoxy resin is 70% or more;
    (B) a phenol resin in which the proportion of the carbon atoms of aromatic derivation to all of the carbon atoms in the phenol resin is 70% or more, and whose phenolic hydroxy equivalent is 140 to 300;
    (C) a curing accelerator, and
    (D) an inorganic filler whose content W (wt %) in the whole epoxy resin composition satisfied $88 \leq W \leq 94$,
    wherein combustion starting temperature in thermogravimetric analysis of the cured epoxy resin composition in an air atmosphere 280° C. or higher.

2. An epoxy resin composition for encapsulating semiconductor elements, consisting essentially of:
   (A) an epoxy resin in which the proportion of the carbon atoms of aromatic derivation to all of the carbon atoms in the resin is 70% or more;
   (B) a phenol resin in which the proportion of the carbon atoms of aromatic derivation to all of the carbon atoms in the phenol resin is 70% or more, and whose phenolic hydroxy eqivalent is 140 to 300;
   (C) a curing acceletaror; and
   (D) an inorganic filler whose content W (wt %) in the whole epoxy resin composition satisfies $88 \leq W \leq 94$, wherein a retention A (wt %) of the cured product in thermogravimetric analysis of the cured epoxy resin composition in an air atmosphere satisfies the formula $W+[0.1\times(100-W)] \leq A$.

3. An epoxy resin composition for encapsulating semiconductor elements according to claim 1, wherein the epoxy resin is represented by formula (1) or formula (2):

(1)

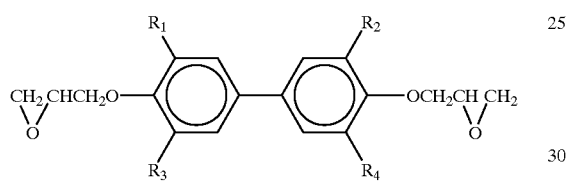

wherein $R_1$ to $R_4$ are a hydrogen atom, a phenyl group or a methyl group and may be identical or different, or (2)

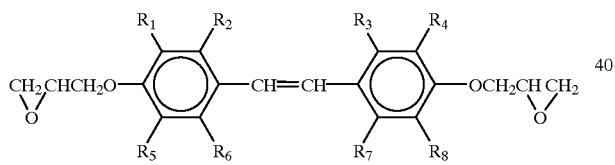

wherein $R_1$ to $R_8$ are a hydrogen atom, a methyl group or a tertiary butyl group and may be identical or different.

4. An epoxy resin composition for encapsulating semiconductor elements according to claim 1, wherein the phenol resin is a resin represented by formula (3) or formula (4), or a resin produced by conducting polycondensation of a petroleum heavy oil, formaldehyde polycondensate and a phenol:

(3)

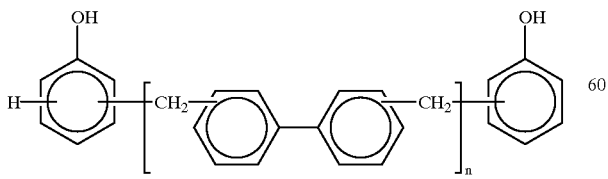

wherein n is a mean value which is a positive number of 1 or greater, or (4)

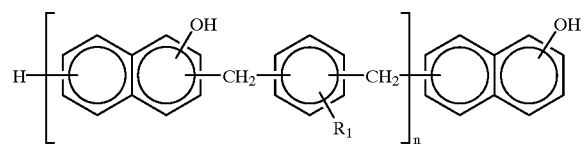

wherein $R_1$ is a hydrogen atom or a methyl group, and n is a mean value which is a positive number of 1 or greater.

5. A semiconductor device, comprising:
   the epoxy resin composition according to claim 1; and
   a semiconductor element, which is encapsulated by the epoxy resin composition.

6. An epoxy resin composition for encapsulating semiconductor elements according to claim 2, wherein the epoxy resin is represented by fonnula (1) or formula (2):

(1)

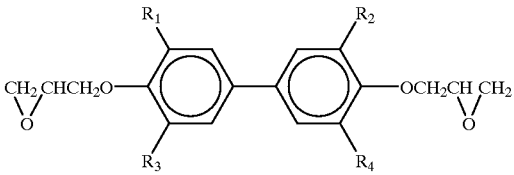

wherein $R_1$ to $R_4$ are a hydrogen atom, a phenyl group or a methyl group and may be identical or different; or (2)

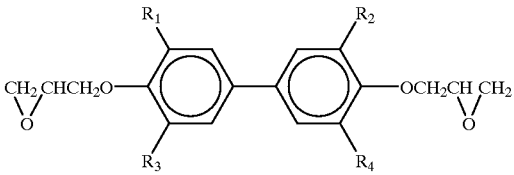

wherein $R_1$ to $R_8$ are a hydrogen atom, a methyl group or a tertiary butyl group and may be identical or different.

7. An epoxy resin composition for encapsulating semiconductor elements according to claim 2, wherein the phenol resin is a resin represented by formula (3) or formula (4), or a resin produced by conducting polycondensation of a petroleum heavy oil, formaldehyde polycondensation and a phenol:

(3)

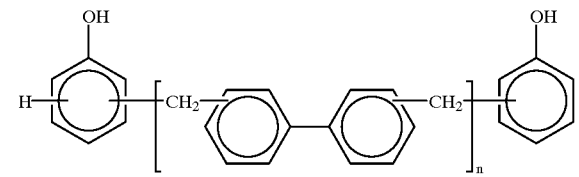

wherein n is a mean value which is a positive number of 1 or greater; or

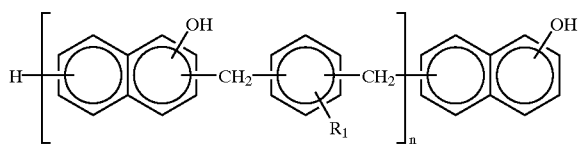

(4)

wherein $R_1$ is a hydrogen atom or a methyl group, and n is a mean value which is a positive number of 1 or greater.

8. A semiconductor device, comprising:
the epoxy resin composition according to claim 2; and
at least one semiconductor element, encapsulated by the epoxy resin composition.

9. A semiconductor device, comprising:
the epoxy resin composition according to claim 3; and
at least one semiconductor element, encapsulated by the epoxy resin composition.

10. A semiconductor device, comprising:
the epoxy resin composition according to claim 4; and
at least one semiconductor element, encapsulated by the epoxy resin composition.

11. The epoxy resin composition according to claim 1, wherein:
the epoxy resin is present in an amount of from 5 to 10% by weight;
the phenol resin is present in an amount of from 5 to 10% by weight; and
the curing accelerator is present in an amount of from 0.05 to 2% by weight.

12. The epoxy resin composition according to claim 2, wherein:
the epoxy resin is present in an amount of from 5 to 10% by weight;
the phenol resin is present in an amount of from 5 to 10% by weight; and
the curing accelerator is present in an amount of from 0.05 to 2% by weight.

13. The epoxy resin composition according to claim 1, wherein an equivalent ratio of the number of epoxy groups in the epoxy resin, to the number of phenolic hydroxyl groups in the phenol resin, is in the range of from 0.5 to 2.

14. The epoxy resin composition according to claim 2, wherein an equivalent ratio of the number of epoxy groups in the epoxy resin, to the number of phenolic hydroxyl groups in the phenol resin, is in the range of from 0.5 to 2.

15. The epoxy resin composition according to claim 1, wherein the composition contains no halogenated compound as a flame retardant.

16. The epoxy resin composition according to claim 2, wherein the composition contains no halogenated compound as a flame retardant.

17. The epoxy resin composition according to claim 1, wherein the composition contains no flame retardant.

18. The epoxy resin composition according to claim 2, wherein the composition contains no flame retardant.

19. The epoxy resin composition according to claim 1, wherein the composition additionally contains at least one member selected from the group consisting of a silane coupling agent, a colorant, a low-stress component, a releasing agent, and an antioxidant.

20. The epoxy resin composition according to claim 2, wherein the composition additionally contains at least one member selected from the group consisting of a silane coupling agent, a colorant, a low-stress component, a releasing agent, and an antioxidant.

* * * * *